(12) United States Patent
Kozuma et al.

(10) Patent No.: US 8,625,058 B2
(45) Date of Patent: Jan. 7, 2014

(54) PHOTODETECTOR AND DISPLAY DEVICE

(75) Inventors: Munehiro Kozuma, Kanagawa (JP);
Yoshiyuki Kurokawa, Kanagawa (JP);
Takayuki Ikeda, Kanagawa (JP);
Hikaru Tamura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 348 days.

(21) Appl. No.: 12/861,476

(22) Filed: Aug. 23, 2010

(65) Prior Publication Data
US 2011/0043735 A1 Feb. 24, 2011

(30) Foreign Application Priority Data
Aug. 24, 2009 (JP) ................. 2009-193302

(51) Int. Cl.
G02F 1/1335 (2006.01)
H01L 31/0232 (2006.01)
H01L 27/14 (2006.01)
H01L 21/00 (2006.01)

(52) U.S. Cl.
USPC ............. 349/106; 257/294; 257/431; 438/60

(58) Field of Classification Search
USPC ........................................ 257/294
See application file for complete search history.

(56) References Cited

U.S. PATENT DOCUMENTS

| | | | |
|---|---|---|---|
| 5,473,453 A | 12/1995 | Kurematsu | |
| 5,666,176 A | 9/1997 | Kurematsu | |
| 6,144,426 A | 11/2000 | Yamazaki et al. | |
| 6,690,437 B2 | 2/2004 | Yamazaki et al. | |
| 6,747,289 B2 | 6/2004 | Yamazaki et al. | |
| 7,002,659 B1 | 2/2006 | Yamazaki et al. | |
| 7,605,354 B2 | 10/2009 | Koyama | |
| 7,622,785 B2 | 11/2009 | Sasagawa et al. | |
| 7,741,667 B2 * | 6/2010 | Jung | 257/294 |
| 7,825,998 B2 | 11/2010 | Chen et al. | |
| 7,847,361 B2 * | 12/2010 | Kokusenya | 257/435 |
| 7,868,368 B2 * | 1/2011 | Park | 257/294 |
| 8,013,955 B2 | 9/2011 | Katoh et al. | |
| 8,035,590 B2 | 10/2011 | Kakinuma et al. | |
| 8,053,816 B2 | 11/2011 | Arao et al. | |
| 8,106,429 B2 * | 1/2012 | Kim | 257/257 |
| 8,129,809 B2 * | 3/2012 | Jang | 257/436 |
| 2002/0063518 A1 | 5/2002 | Okamoto et al. | |
| 2002/0107055 A1 | 8/2002 | Yamazaki et al. | |
| 2006/0131598 A1 * | 6/2006 | Koh | 257/98 |
| 2006/0275944 A1 * | 12/2006 | Hyun | 438/70 |

(Continued)

FOREIGN PATENT DOCUMENTS

| | | |
|---|---|---|
| JP | 05-313153 A | 11/1993 |
| JP | 2005-010690 A | 1/2005 |

Primary Examiner — Michelle R Connelly
(74) Attorney, Agent, or Firm — Fish & Richardson P.C.

(57) ABSTRACT

The amount of light incident on a photoelectric conversion element is increased while stray light from a backlight below a light-transmitting substrate is prevented from being incident on the photoelectric conversion element. A light-blocking film is formed with a color filter covering a photoelectric conversion element over a light-transmitting substrate and a color filter covering a photoelectric conversion element in an adjacent pixel which overlap each other at the side with respect to the direction in which light travels. In addition, by providing a microlens over the color filter, light which is conventionally not detected is collected to a photoelectric conversion element, and accordingly the amount of light incident on the photoelectric conversion element is increased.

23 Claims, 10 Drawing Sheets

(56) References Cited

U.S. PATENT DOCUMENTS

| | | |
|---|---|---|
| 2007/0113886 A1 | 5/2007 | Arao et al. |
| 2007/0155083 A1* | 7/2007 | Park .............................. 438/199 |
| 2007/0210344 A1 | 9/2007 | Arao et al. |
| 2009/0057725 A1* | 3/2009 | Kim .............................. 257/252 |
| 2009/0141004 A1 | 6/2009 | Yamazaki |
| 2009/0161047 A1 | 6/2009 | Cho et al. |
| 2009/0325338 A1* | 12/2009 | Jung .............................. 438/70 |
| 2010/0007632 A1 | 1/2010 | Yamazaki |
| 2010/0117991 A1 | 5/2010 | Koyama et al. |
| 2011/0042766 A1 | 2/2011 | Kurokawa et al. |

* cited by examiner

PHOTODETECTOR AND DISPLAY DEVICE

BACKGROUND OF THE INVENTION

1. Field of the Invention

One embodiment of the present invention relates to a photodetector including a photodiode, and a display device including a photodiode.

2. Description of the Related Art

Patent Document 1 discloses a liquid crystal display device having an input function using a photosensor. Specifically, the liquid crystal display device includes a switching element and a photoelectric conversion element over a light-transmitting substrate. The thickness of the light-transmitting, substrate is 70 μm to 100 μm. The light-transmitting substrate having such a thickness prevents stray light from a backlight below the light-transmitting substrate from being incident on the photoelectric conversion element. On the other hand, light from an object to be detected which is located over the photoelectric conversion element is incident on the photoelectric conversion element.

[Reference]
[Patent Document 1] Japanese Published Patent Application No. 2005-10690

SUMMARY OF THE INVENTION

The photosensitivity of a photoelectric conversion element (photodiode) increases as the amount of incident light increases. However, in the case where a photodiode is formed in a display portion, it is difficult to increase the area of a light receiving portion of the photodiode in view of an aperture ratio. It is therefore difficult to ensure a sufficient amount of light incident on a photodiode, and it is difficult to increase photosensitivity. In addition, in the case where light from a backlight, or part of light (oblique light) from an object to be detected, is incident on a photoelectric conversion element, light that should not be detected is also detected, which results in a decrease in photodetection accuracy of the photoelectric conversion element.

In view of the above problems, an embodiment of the present invention discloses a structure capable of preventing light (stray light) from a backlight from being incident on a photodiode and capable of preventing oblique light (stray light) from an object to be detected from being incident on a photodiode, while increasing the amount of light incident on a photodiode.

An embodiment of the present invention is a photodetector including a first light-blocking layer and a second light-blocking layer over a light-transmitting substrate; a first photodiode over the first light-blocking layer; a second photodiode over the second light-blocking layer; a first color filter covering the first photodiode; a second color filter covering the second photodiode; a third light-blocking layer formed with the first color filter and the second color filter between the first photodiode and the second photodiode; and lenses over the first photodiode and the second photodiode.

A photodetector of the present invention includes a first photodiode and a second photodiode over a light-transmitting substrate; a first color filter covering the first photodiode; a second color filter covering the second photodiode; a first microlens over the first color filter; a second microlens over the second color filter; and a light-blocking layer formed with the first color filter and the second color filter between the first photodiode and the second photodiode.

A photodetector of the present invention includes a first photodiode and a second photodiode over a light-transmitting substrate; a first microlens over the first photodiode; a second microlens over the second photodiode; a first color filter covering the first microlens; a second color filter covering the second microlens; and a light-blocking layer formed with the first color filter and the second color filter between the first photodiode and the second photodiode.

A photodetector of the present invention includes a first light-blocking layer and a second light-blocking layer over a light-transmitting substrate; a light-transmitting insulating film over and in contact with the light-transmitting substrate, the first light-blocking layer, and the second light-blocking, layer; a first photodiode over the first light-blocking layer with the light-transmitting insulating film interposed therebetween; a second photodiode over the second light-blocking layer with the light-transmitting insulating film interposed therebetween; a first color filter covering the first photodiode; a second color filter covering the second photodiode; a first microlens over the first color filter; a second microlens over the second color filter; and a third light-blocking layer formed with the first color filter and the second color filter arranged side by side between the first photodiode and the second photodiode.

A photodetector of the present invention includes a first light-blocking layer and a second light-blocking layer over a light-transmitting substrate; a light-transmitting insulating film over and in contact with the light-transmitting substrate, the first light-blocking layer, and the second light-blocking layer; a first photodiode over the first light-blocking layer with the light-transmitting insulating film interposed therebetween; a second photodiode over the second light-blocking layer with the light-transmitting insulating film interposed therebetween; a first microlens over the first photodiode; a second microlens over the second photodiode; a first color filter covering the first microlens; a second color filter covering the second microlens; and a third light-blocking layer formed with the first color filter and the second color filter arranged side by side between the first photodiode and the second photodiode.

A display device of the present invention includes a backlight; a first light-transmitting substrate over the backlight; a liquid crystal layer over the first light-transmitting substrate; a second light-transmitting substrate over the liquid crystal layer; a first light-blocking layer and a second light-blocking layer over the second light-transmitting substrate; a first photodiode over the first light-blocking layer; a second photodiode over the second light-blocking layer; a first color filter covering the first photodiode; a second color filter covering the second photodiode; a first microlens over the first color filter; a second microlens over the second color filter; and a third light-blocking layer formed with the first color filter and the second color filter between the first photodiode and the second photodiode.

A display device of the present invention includes a first light-transmitting substrate; a light-emitting layer over the first light-transmitting substrate; a second light-transmitting substrate over the light-emitting layer; a first photodiode over a first light-blocking layer; a second photodiode over a second light-blocking layer; a first color filter covering the first photodiode; a second color filter covering the second photodiode; a first microlens over the first color filter; a second microlens over the second color filter; and a third light-blocking layer formed with the first color filter and the second color filter between the first photodiode and the second photodiode.

When a microlens with an appropriate focus is formed in a pixel portion, light transmitted through the microlens is collected to each photodiode, which enables even low-intensity incident light to be detected with high sensitivity. In addition, the increase in the amount of light collected makes it possible to reduce the area of a photosensor and decrease the circuit area.

Furthermore, light not having a focus at a photodiode (stray light) is blocked by a light-blocking layer including color filters. In other words, oblique light from above the first photodiode is blocked by the third light-blocking layer, and oblique light from above the second photodiode is blocked by the third light-blocking layer. Therefore, the first photodiode and the second photodiode do not detect light over the second photodiode and light over the first photodiode, respectively. The first photodiode and the second photodiode can accurately detect light that should be detected; thus, the photosensitivity of the first photodiode and the second photodiode can be improved.

DETAILED DESCRIPTION OF THE INVENTION

Hereinafter, an embodiment and examples of the present invention will be described. Note that the present invention can be carried out in many different modes, and it is easily understood by those skilled in the art that modes and details of the present invention can be modified in various ways without departing from the purpose and the scope of the present invention. Therefore, the present invention should not be interpreted as being limited to the description in the embodiment and examples.

(Embodiment 1)

Figure 1A:
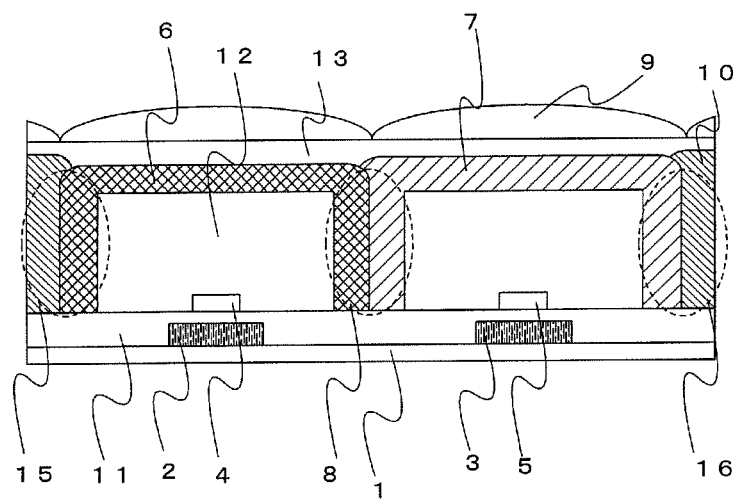
FIGS. 1A and 1B are cross-sectional views illustrating Embodiment 1 which is one mode of the present invention.

A photodetector which is one mode of the present invention will be described (FIG. 1A). FIG. 1A is a cross-sectional view of the photodetector.

The photodetector which is one mode of the present invention includes a first light-blocking layer 2 and a second light-blocking layer 3 over a substrate 1 having a light-transmitting property, a first photodiode 4 over the first light-blocking layer 2, a second photodiode 5 over the second light-blocking layer 3, a first color filter 6 covering the first photodiode 4, and a second color filter 7 covering the second photodiode 5. The photodetector includes a third light-blocking layer 8 formed with the first color filter 6 and the second color filter 7 between the first photodiode 4 and the second photodiode 5. The photodetector also includes microlenses 9 over the first color filter 6 and the second color filter 7 with a third light-transmitting insulating film 13 interposed therebetween.

In order to collect light to the photodiodes, plano-convex lenses are formed as the microlenses 9 with a material having a higher refractive index than the surroundings. Alternatively, a microlens may be formed with two cylindrical lenses oriented perpendicular to each other. Further alternatively, in the case of using a material having a lower refractive index than the surroundings, a concave lens may be formed.

If a microlens is formed such that the lens covers the whole area of each pixel, the optical path of backlight light emitted through an aperture area is changed, which results in a distortion of display images. The microlenses 9 are preferably formed only directly above photodiodes so as not to adversely affect display images.

The microlenses 9 can be set to have an optimal focal length by appropriately selecting their shape or material. The thicknesses of a second light-transmitting insulating film 12, the third light-transmitting insulating film 13, and the color filters are adjusted so that the first photodiode 4 or the second photodiode 5 is located at the focal point.

Figure 1B:
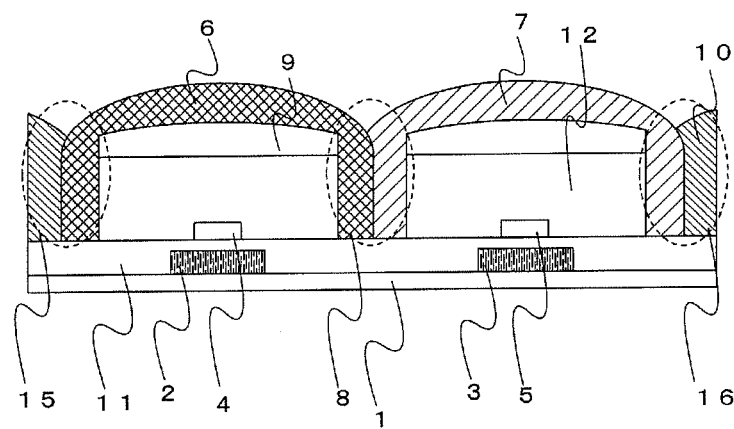

Note that the microlenses may be formed under the color filters (FIG. 1B). In that case, it is preferable that the thickness of the second light-transmitting insulating film 12 be appropriately adjusted depending on the focal length.

The third light-blocking layer 8 is formed with the first color filter 6 and the second color filter 7 which are arranged side by side. In other words, one end of the first color filter 6 and one end of the second color filter 7 are arranged side by side. This portion serves as the third light-blocking layer 8.

A fourth light-blocking layer 15 formed with a third color filter 10 and the first color filter 6 may be provided on a side of the first photodiode 4 which is opposite to the side where the third light-blocking layer 8 is provided. One end of the third color filter 10 and the other end of the first color filter 6 are arranged side by side, and this portion serves as the fourth light-blocking layer 15. In addition, a fifth light-blocking layer 16 formed with the third color filter 10 and the second color filter 7 may be provided on a side of the second photodiode 5 which is opposite to the side where the third light-blocking layer 8 is provided. One end of the third color filter 10 and the other end of the second color filter 7 are arranged side by side, and this portion serves as the fifth light-blocking layer 16.

A first light-transmitting insulating film 11 may be provided over and in contact with the substrate 1, the first light-blocking layer 2, and the second light-blocking layer 3. The first photodiode 4 may be formed over the first light-blocking layer 2 with the first light-transmitting insulating film 11 interposed therebetween. The second photodiode 5 may be formed over the second light-blocking layer 3 with the first light-transmitting insulating film 11 interposed therebetween. The third light-blocking layer 8 may be formed in contact with the first light-transmitting insulating film 11.

The second light-transmitting insulating films 12 may be formed over the first light-transmitting insulating film 11, the first photodiode 4, and the second photodiode 5. The first color filter 6 may be formed over the first photodiode 4 with the second light-transmitting insulating film 12 interposed therebetween. The second color filter 7 may be formed over the second photodiode 5 with the second light-transmitting insulating film 12 interposed therebetween.

Figure 2:
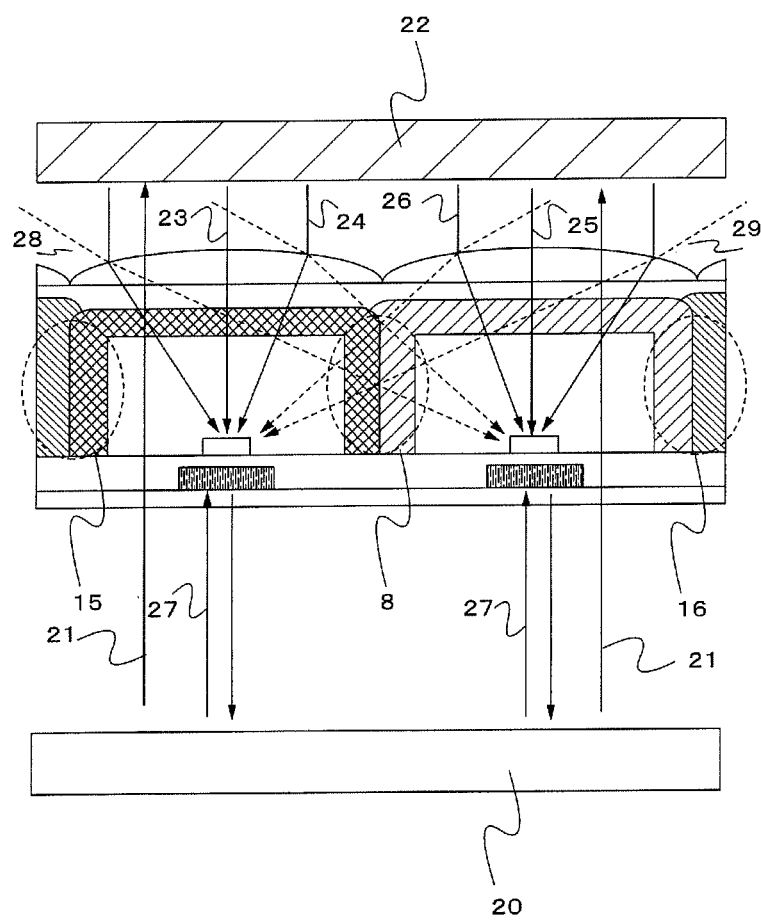
FIG. 2 is a cross-sectional view illustrating Embodiment 1 which is one mode of the present invention.

A photodetection method using a photodetector which is one mode of the present invention will be described below (FIG. 2). Light 21 emitted from a backlight 20 below the substrate 1 having a light-transmitting property passes through the substrate 1 and the first color filter 6 or the second color filter 7 and is reflected off a portion 22 to be detected. Light 23 and light 24 reflected off the portion 22 to be detected are collected by the microlens and detected by the first photodiode 4. In addition, light 25 and light 26 reflected off the portion 22 to be detected are collected by the microlens and detected by the second photodiode 5.

Note that the light 24 and the light 26 reflected are not detected in the absence of the microlenses because the light 24 and the light 26 do not enter the first photodiode 4 or the second photodiode 5. On the other hand, by using the structure of this embodiment, the light 24 and the light 26 are collected to the photodiodes by the microlenses 9 and can be detected by the first photodiode 4 and the second photodiode 5, respectively.

Part of the light 21 from the backlight becomes light 27 directed to the first photodiode 4 and the second photodiode 5. However, the light 27 is absorbed or reflected by the first light-blocking layer 2 and the second light-blocking layer 3. Therefore, the light 27 is not incident on the first photodiode 4 and the second photodiode 5 and hence is not detected. On the other hand, in the structure in Patent Document 1, it is possible that the light 27 is detected by the first photodiode 4 and the second photodiode 5 because the first light-blocking layer 2 and the second light-blocking layer 3 are not provided.

Part of light reflected from the portion 22 to be detected becomes light 28 and light 29. Each of the light 28 and the light 29 is oblique light. The light 28 is obliquely directed to the second photodiode 5. The light 29 is obliquely directed to the first photodiode 4. However, the light 28 is blocked by the third light-blocking layer 8. Thus, the light 28 is not incident on the second photodiode 5 and hence is not detected. The light 29 is blocked by the third light-blocking layer 8. Thus, the light 29 is not incident on the first photodiode 4 and hence is not detected. On the other hand, in the structure in Patent Document 1, the third light-blocking layer 8 is not provided, and therefore the light 28 is detected by the second photodiode 5 and the light 29 is detected by the first photodiode 4.

The third light-blocking layer 8 between the first photodiode 4 and the second photodiode 5 is formed with the first color filter 6 and the second color filter 7 which are arranged side by side. The third light-blocking layer 8 can be formed with a metal film or a resin film that has a black material dispersed or black fine particles dispersed therein. In that case, however, the number of manufacturing steps is significantly increased. In one mode of the present invention, the third light-blocking layer is formed with the first color filter 6 and the second color filter 7 which are arranged side by side, and thus the number of manufacturing steps is not increased. In addition, the light 21 can be colored by the first color filter 6, the second color filter 7, and the third color filter 10, which enables the photodetector to be used as a color sensor.

When the first photodiode 4 and the second photodiode 5 are formed over and in contact with the first light-transmitting insulating film 11 and the third light-blocking layer is formed over and in contact with the first light-transmitting insulating film 11, the oblique lights 28 and 29 can be reliably blocked.

Components of the photodetector will be described below.

The substrate 1 transmits visible light and preferably has a thickness of 10 μm to 200 μm. For example, a plastic substrate that has flexibility and transmits visible light, or an inorganic material substrate that transmits visible light, can be used. Examples of the material of the plastic substrate include: polyester typified by polyethylene terephthalate (PET); polyether sulfone (PES); polyethylene naphthalate (PEN); polycarbonate (PC); polyether ether ketone (PEEK); polysulfone (PSF); polyetherimide (PEI); polyarylate (PAR); polybutylene terephthalate (PBT); polyimide; acrylonitrile butadiene styrene resin; polyvinyl chloride; polypropylene; polyvinyl acetate; and acrylic resin. Examples of the inorganic material substrate include a glass substrate, a quartz substrate, and the like.

The first light-blocking layer 2 prevents the light 27 from the backlight 20 from being incident on the first photodiode 4. The second light-blocking layer 3 prevents the light 27 from the backlight 20 from being incident on the second photodiode 5. The first light-blocking layer 2 and the second light-blocking layer 3 can be island-shaped. The first light-blocking layer 2 and the second light-blocking layer 3 are formed using a material capable of blocking light, by a sputtering method, a CVD method, or a coating method. As the material capable of blocking light, for example, a material mainly containing chromium, a resin containing a carbon black, or a resin containing a black pigment such as titanium lower oxide whose oxidation number is smaller than that of titanium dioxide can be used.

The first photodiode 4 detects the light 23 and the light 24 which are reflected by the portion 22 to be detected and are collected by the microlens. The second photodiode 5 detects the light 25 and the light 26 which are reflected by the portion 22 to be detected and are collected by the microlens.

Figure 3B:
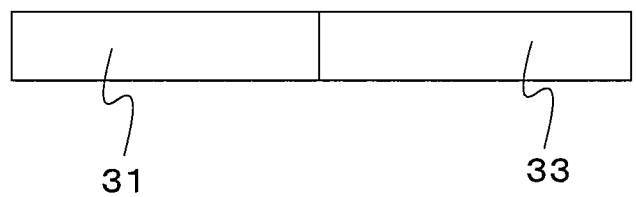
Figure 3C:
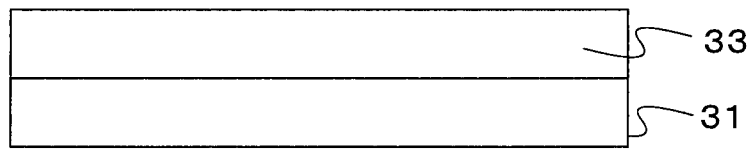
Figure 4A:
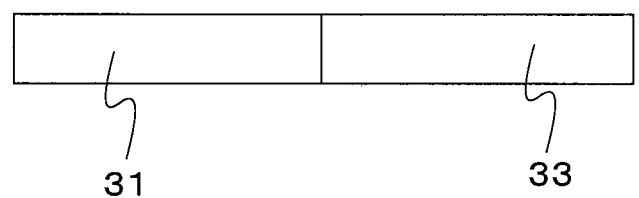
FIGS. 4A and 4B are cross-sectional views illustrating Embodiment 1 which is one mode of the present invention.
Figure 4B:
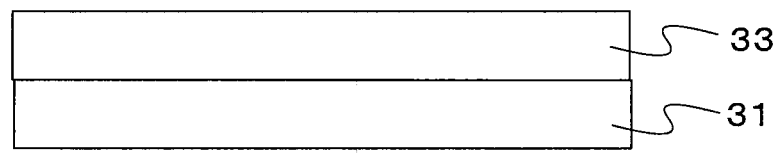

The first photodiode 4 and the second photodiode 5 are each a PIN diode (FIG. 3B or 3C) or a PN diode (FIG. 4A or 4B). The first photodiode 4 and the second photodiode 5 are formed using a semiconductor film. A PIN diode includes a region of p-type conductivity (a p-type layer 31), a region of i-type conductivity (an i-type layer 32), and a region of n-type conductivity (an n-type layer 33). A PN diode includes a p-type layer 31 and an n-type layer 33. The p-type layer 31, the n-type layer 33, and the i-type layer 32 are formed using a film of a semiconductor such as silicon or formed using an oxide semiconductor film containing ZnO or the like. The semiconductor film may be amorphous, microcrystalline, crystalline, or single-crystal.

The first color filter 6, the second color filter 7, and the third color filter 10 are color filters which transmit light of red, blue, or green. Two or more different color filters which overlap each other with respect to the direction in which light travels transmit very little visible light and function as a light-blocking film. In addition, the color filters color the light 21 from the backlight 20. The colored light is reflected by the portion 22 to be detected and becomes the lights 23 to 26, the light 28, and the light 29.

The lights 23 and 24 pass through the first color filter 6 and are then detected by the first photodiode 4. The lights 25 and 26 pass through the second color filter 7 and are then detected by the second photodiode 5. The first color filter 6 and the second color filter 7 cover the first photodiode 4 and the second photodiode 5, respectively.

The first color filter 6, the second color filter 7, and the third color filter 10 are selectively formed by photolithography after applying an organic resin such as an acrylic-based resin in which a pigment is dispersed. Alternatively, the first color filter 6, the second color filter 7, and the third color filter 10 can be selectively formed by etching after applying a polyimide-based resin in which a pigment is dispersed. Alternatively, the first color filter 6, the second color filter 7, and the third color filter 10 can be selectively formed by a droplet discharge method such as an inkjet method.

The third light-blocking layer 8 prevents the oblique light 28 and the oblique light 29 of the light reflected from the portion 22 to be detected from being detected by the second photodiode 5 and the first photodiode 4, respectively. The third light-blocking layer 8 between the first photodiode 4 and the second photodiode 5 is formed as described above, such that the first color filter 6 and the second color filter 7 overlap each other with respect to the direction in which light travels. After one of the first color filter 6 and the second color filter 7 is selectively formed, the other of the first color filter 6 and the second color filter 7 is selectively formed such that the first color filter 6 and the second color filter 7 overlap each other with respect to the directions in which the oblique light 28 and the oblique light 29 travel.

The first light-transmitting insulating film 11 prevents an alkali metal such as Na or an alkaline earth metal contained in the substrate 1 from diffusing into the first photodiode 4 and the second photodiode 5 and from adversely affecting the characteristics. The first light-transmitting insulating film 11 is formed using an insulating material such as silicon oxide, silicon nitride, silicon oxynitride, or silicon nitride oxide, by a CVD method, a sputtering method, or the like.

By forming the first photodiode 4, the second photodiode 5, and the third light-blocking layer 8 over and in contact with the first light-transmitting insulating film 11, the oblique light 28 and the oblique light 29 can be reliably prevented from being detected by the first photodiode 4 and the second photodiode 5, respectively.

The second light-transmitting insulating films 12 and the third light-transmitting insulating film 13 prevent an alkali metal such as Na or an alkaline earth metal from the outside from diffusing into the first photodiode 4 and the second photodiode 5 and from adversely affecting the characteristics. Each of the second light-transmitting insulating film and the third light-transmitting insulating film is formed by a plasma CVD method, a sputtering method, or the like using a single layer or a stacked layer of any of the following films: a silicon film; a silicon oxide film; a silicon oxynitride film; a silicon nitride oxide film; and a film containing an organic material such as an organic resin with high planarity. Note that the second light-transmitting insulating films 12 and the third light-transmitting insulating film 13 preferably have high planarity because the microlenses are formed thereover.

The microlenses collect light, which is reflected from the portion 22 to be detected, to the photodiodes. Because the amount of light incident on the photodiodes increases, the sensitivity of the photodiodes can be increased.

A material for forming the microlenses may be any material that has high transmittance and is easy to process. An inorganic film such as a silicon film, a silicon oxide film, a silicon oxynitride film, or a silicon nitride oxide film, or a resin can be used. Alternatively, a lens-shaped cavity may be provided between layers, and may be filled with air or may be vacuum. In the case of a convex lens, a material is selected such that the lens has a high relative refractive index (higher than 1.0) with respect to a material stacked thereon. In the case of a concave lens, a material is selected such that the lens has a low relative refractive index (lower than 1.0) with respect to a material stacked thereon.

For example, in the case of forming a microlens with a resin, a columnar photoresist pattern is manufactured by photolithography, and then the substrate is heated to make the resist flow and a lens shape is formed by surface tension by a reflow method. Alternatively, a small amount of a resin material may be dropped to a predetermined position by using an inkjet printer head, and a lens shape may be manufactured by surface tension.

A microlens can also be formed by drawing with an electron beam such that a material is partially melted and the dielectric constant is changed. In the case of manufacturing a lens on a counter substrate side, the lens can be formed by forming a spherical lens shape (with a specified value of curvature radius) on glass and attaching it to another glass.

A method of manufacturing the photodetector will be described below.

Figure 3A:
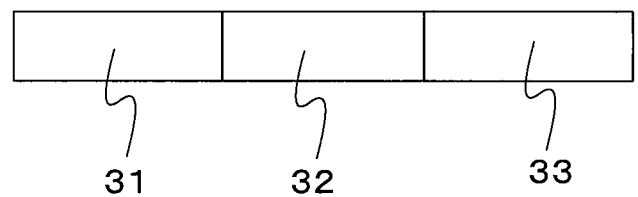
FIGS. 3A to 3C are cross-sectional views illustrating Embodiment 1 which is one mode of the present invention.

A light-blocking film is formed using a material capable of blocking light over the substrate 1, by a sputtering method, a CVD method, or a coating method (not illustrated). The light-blocking film is processed by a photolithography method and an etching method, and the first light-blocking layer 2 and the second light-blocking layer 3 are formed (FIG. 3A). The first light-blocking layer 2 and the second light-blocking layer 3 may be formed by selectively applying a material capable of blocking light to the substrate 1 by a droplet discharge method. A light-transmitting insulating film may be formed over the substrate 1, and the first light-blocking layer 2 and the second light-blocking layer 3 may be formed over the insulating film.

The first light-transmitting insulating film 11 is formed over the substrate 1, the first light-blocking layer 2, and the second light-blocking layer 3 by a sputtering method, a CVD method, or a coating method (FIG. 3A). The first light-transmitting insulating film 11 may be a single-layer film or a stacked-layer film.

The first photodiode 4 and the second photodiode 5 are formed over the first light-transmitting insulating film 11 (FIG. 3A).

The first photodiode 4 and the second photodiode 5 are each a PIN diode or a PN diode. The PIN diode may be a lateral junction diode (FIG. 3B) or a vertical-junction diode (FIG. 3C). Similarly, the PN diode may be a lateral junction diode (FIG. 4A) or a vertical junction diode (FIG. 4B). The lateral junction diode is formed as follows: a p-type layer 31, an i-type layer 32, and an n-type layer 33 are formed in a semiconductor film by ion doping or the like. The vertical junction diode is formed as follows: the p-type layer 31 is formed using a p-type semiconductor film, the i-type layer 32 is formed using an i-type semiconductor film, and the n-type layer 33 is formed using an n-type semiconductor film. It the reverse order, it is also acceptable that the n-type layer 33 is formed, the i-type layer 32 is formed, and the p-type layer 31 is formed. Each of the p-type layer 31 and the n-type layer 33 is provided with an extracting electrode (not illustrated).

Figure 5A:
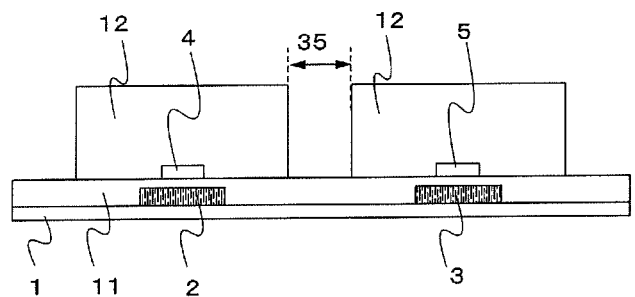
FIGS. 5A to 5C are cross-sectional views illustrating Embodiment 1 which is one mode of the present invention.

A light-transmitting insulating film is formed over the first light-transmitting insulating film 11, the first photodiode 4, and the second photodiode 5 (not illustrated). The second light-transmitting insulating films 12 are formed by processing the insulating film by a photolithography method and an etching method (FIG. 5A). A space 35 is made adequately large because the first color filter 6 and the second color filter 7 are arranged side by side between the first photodiode 4 and the second photodiode 5 to form the third light-blocking layer.

Figure 5B:
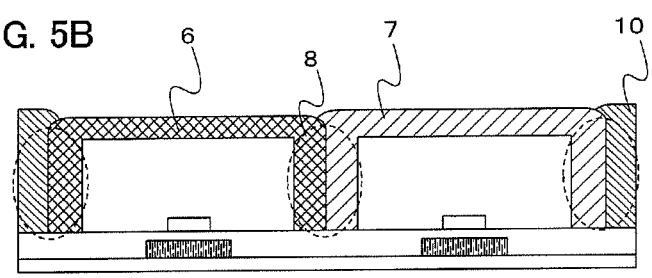

After an application of an organic resin in which pigment is dispersed, the organic resin is processed by photolithography and etching to form the first color filter 6. Next, after an application of an organic resin in which a pigment of a color different from that of the first color filter 6 is dispersed, the organic resin is processed by photolithography and etching to form the second color filter 7. The first color filter 6 and the second color filter 7 are arranged side by side between the first photodiode 4 and the second photodiode 5 to form the third light-blocking layer 8. Lastly, after an application of an organic resin in which a pigment of a color different from those of the first color filter 6 and the second color filter 7 is dispersed, the organic resin is processed by photolithography and etching to form the third color filter 10. The first color filter 6 and the third color filter 10 are arranged side by side and the second color filter 7 and the third color filter 10 are arranged side by side to form the third light-blocking layers 8 (FIG. 5B).

Figure 5C:
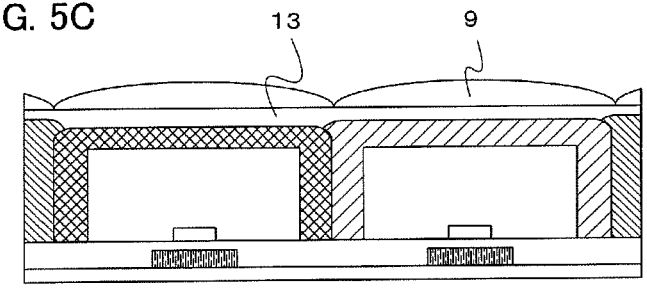

The third light-transmitting insulating film 13 is formed over the first color filter 6, the second color filter 7, and the third color filter 10 by a sputtering method, a CVD method, or a coating method (FIG. 5C). The third light-transmitting insulating film 13 may be a single-layer film or a stacked-layer film.

Over the third light-transmitting insulating film 13, the microlenses 9 are formed so as to be located directly above the first photodiode 4 and the second photodiode 5 (FIG. 5C). A columnar photoresist pattern is manufactured with a resin by photolithography, and then the substrate is heated to make the resist flow and a lens shape is formed by surface tension by a reflow method. Alternatively, a small amount of a resin material may be dropped to a predetermined position by using an inkjet printer head, and a lens shape may be manufactured by surface tension.

A microlens can also be formed by drawing with an electron beam such that a material is partially melted and the dielectric constant is changed. In the case of manufacturing a lens on a counter substrate side, the lens can be formed by forming a spherical lens shape (with a specified value of curvature radius) on the counter substrate and attaching it to a TFT formation substrate. Through the above steps, the photodetector can be manufactured.

EXAMPLE 1

Figure 6:
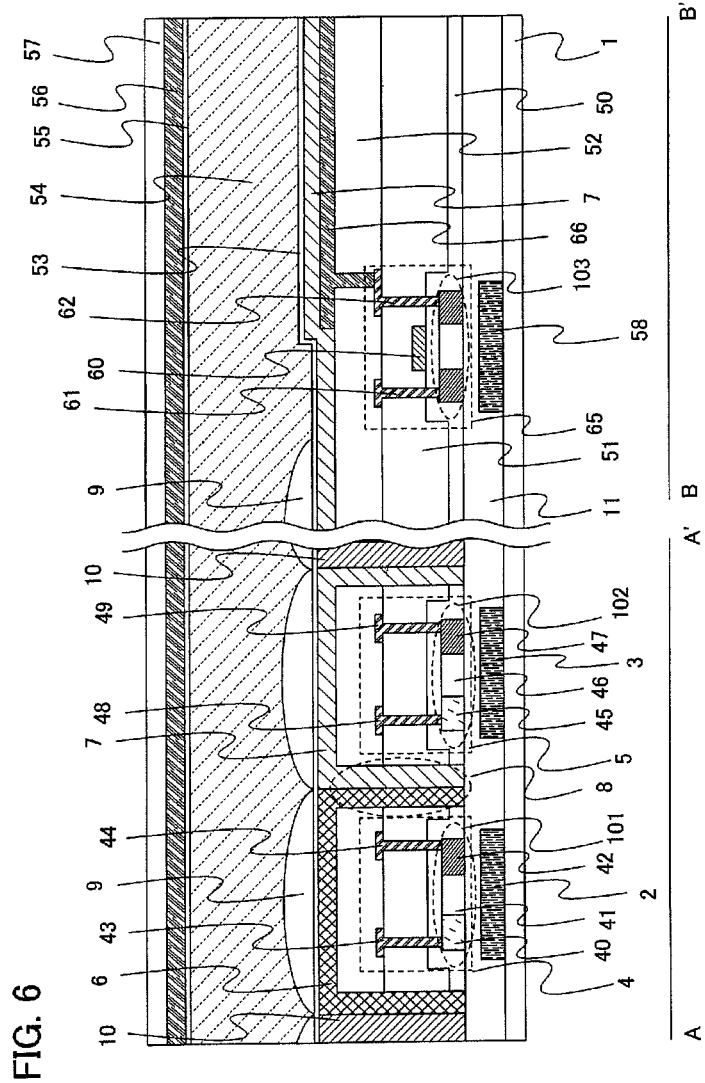
FIG. 6 is a cross-sectional view illustrating Example 1 which is one mode of the present invention.
Figure 7:
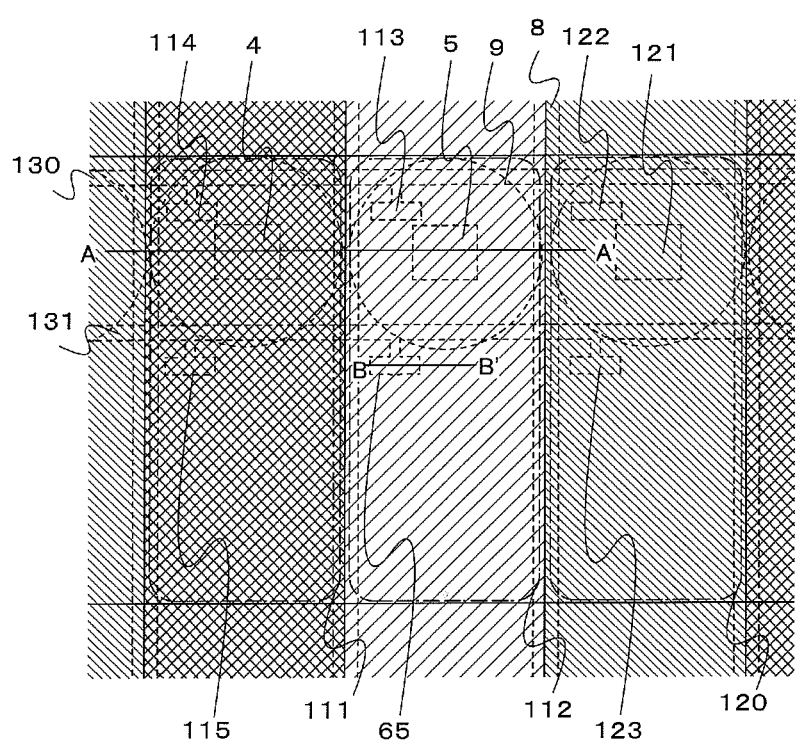
FIG. 7 is a top view illustrating Example 1 which is one mode of the present invention.

A liquid crystal display device which is one mode of the present invention will be described (FIGS. 6 and 7). FIG. 6 is a cross-sectional view of the liquid crystal display device, and FIG. 7 is a top view of a pixel portion of the liquid crystal display device.

The display device which is one mode of the present invention has a photodetection portion A-A' and a display portion B-B'.

A top schematic view of the pixel portion of the display device is illustrated in FIG. 7. The photodetection portion A-A' of FIG. 6 corresponds to an A-A' portion of FIG. 7, and the display portion B-B' of FIG. 6 corresponds to a B-B' portion of FIG. 7.

Note that a photodetection method in the liquid crystal display device of this example is basically similar to Embodiment 1. Light emitted from a backlight below the substrate 1 having a light-transmitting property is transmitted through the substrate 1 and the first color filter 6 or the second color filter 7 and reflected off a portion to be detected. The light reflected by the portion to be detected is collected by microlenses 9 and detected by the first photodiode 4 and the second photodiode 5.

A pixel 112 has at least the second color filter 7, the second photodiode 5, a semiconductor element 113 for controlling signal reading of the second photodiode 5, and a semiconductor element 65 connected to a pixel electrode 66. Similarly, a pixel 111 has at least the first color filter 6, the first photodiode 4, a semiconductor element 114, and a semiconductor element 115. A pixel 120 has at least the third color filter 10, a photodiode 121, a semiconductor element 122, and a semiconductor element 123.

In addition, in the pixel portion, a first scan line 130 connected to gates of the semiconductor element 113, the semiconductor element 114, and the semiconductor element 122, first to third signal lines (not shown) connected to source regions or drain regions thereof, a second scan line 131 connected to gates of the semiconductor element 65, the semiconductor element 115, and the semiconductor element 123, and fourth to sixth signal lines (not illustrated) connected to source regions or drain regions thereof are provided.

In addition, the pixel 111, the pixel 112, and the pixel 120 may each have a storage capacitor.

The photodetection portion has the same structure as that in Embodiment 1. The first photodiode 4 and the second photodiode 5 are each a lateral-junction PIN diode. It is also acceptable that the first photodiode 4 and the second photodiode 5 are each a vertical-junction diode. Furthermore, it is also acceptable that the first photodiode 4 and the second photodiode 5 are each a PN diode. In addition, in a position directly above each of the first color filter 6, the second color filter 7, and the third color filter 10, the microlens 9 is provided.

The first photodiode 4 has a semiconductor layer 101 including a p-type layer 40, an i-type layer 41, and an n-type layer 42 and electrodes 43 and 44. The second photodiode 5 has a semiconductor layer 102 including a p-type layer 45, an i-type layer 46, and an n-type layer 47 and electrodes 48 and 49.

The electrodes 43 and 44 are formed over a light-transmitting insulating film 51 and connected to the semiconductor layer 101 via contact holes formed in a light-transmitting insulating film 50 and the light-transmitting insulating film 51. The electrodes 48 and 49 are also similar.

A light-transmitting insulating film 52 is formed over the light-transmitting insulating film 51 and the electrodes 43, 44, 48, and 49. The first color filter 6, the second color filter 7, and the third color filter 10 are formed over the light-transmitting insulating film 52. The light-transmitting insulating films 50 to 52 correspond to the second light-transmitting insulating film 12 of Embodiment 1.

An alignment film 53 is formed over the first color filter 6, the second color filter 7, and the third color filter 10. Although not illustrated, a light-transmitting insulating film may be provided as needed for the purposes of adjusting a focal length, planarizing a microlens formation surface, and the like. In this case, the light-transmitting insulating film may be provided only in the photodetection portion but not in the display portion. The alignment film 53, or the light-transmitting insulating film provided over the color filters, corresponds to the third light-transmitting insulating film 13 of Embodiment 1.

The microlenses 9 are provided over the alignment film 53. The microlenses 9 is located directly above each of the first photodiode 4 and the second photodiode 5 that are provided therebelow.

As in Embodiment 1, the first light-blocking layer 2 is formed below the first photodiode 4, and the second light-blocking layer 3 is formed below the second photodiode 5.

Further, as in Embodiment 1, the third light-blocking layer 8 is formed between the first photodiode 4 and the second photodiode 5, and the third light-blocking layer 8 is formed with the first color filter 6 and the second color filter 7. When the third light-blocking layer 8 is formed in contact with the first light-transmitting insulating film 11, oblique light from an object to be detected is not detected by the first photodiode 4 or the second photodiode 5.

The third light-blocking layer 8 is formed with the first color filter 6 and the second color filter 7 that are arranged side by side. The third light-blocking layer 8 is formed in a direction parallel to the first to sixth signal lines. If these signal lines are formed in an aperture area, the aperture ratio is lowered. Thus, the first to sixth signal lines are desirably formed over or under the third light-blocking layer 8.

The display portion includes the semiconductor element 65 and a liquid crystal element. The semiconductor element 65 has a semiconductor layer 103 including a source region and a drain region, a gate electrode 60, an electrode 61 electrically connected to a source wiring, and an electrode 62 electrically connected to a pixel electrode.

The semiconductor element 65 is an n-type or p-type transistor and has the semiconductor layer 103 including a source region and a drain region, the light-transmitting insulating film 50 functioning as a gate insulating film, the gate electrode 60, the source electrode 61, and the drain electrode 62. In addition, a light-blocking layer may be formed over the semiconductor element 65. Although a top-gate transistor is shown in FIG. 6, a bottom-gate transistor can be used instead. Furthermore, a structure with an LDD or the like can be used.

The semiconductor element 65 is a switch for applying a potential to control the light polarization direction of a liquid crystal layer 54 of the liquid crystal element. The semiconductor element 113 is a switch for controlling signal reading of the second photodiode 5. As the semiconductor element 65, the one described above can be used. The semiconductor layer 102 is formed using a semiconductor film capable of generating a photocurrent, such as silicon. The semiconductor film may be amorphous, microcrystalline, crystalline, or single-crystal. The semiconductor element 113 is formed using a film of a semiconductor such as silicon or formed using an oxide semiconductor including ZnO or the like. The semiconductor element 65 and the semiconductor element 113 are provided in each pixel.

The first light-transmitting insulating film 11 is the same as that in Embodiment 1. The light-transmitting insulating film 50 is a gate insulating film. The light-transmitting insulating film 50 is formed using an insulating material such as silicon oxide, silicon nitride, silicon oxynitride, or silicon nitride oxide. The light-transmitting insulating film 50 is formed by a CVD method, a sputtering method, thermal oxidation, thermal nitridation, plasma oxidation, plasma nitridation, a coating method, or the like. The light-transmitting insulating film 51 and the light-transmitting insulating film 52 are preferably insulating films with planarity. Each of the light-transmitting insulating film 51 and the light-transmitting insulating film 52 is a single layer or a stacked layer of any of the following films: a silicon oxide film; a silicon oxynitride film; a silicon nitride oxide film; and a film containing an organic material such as an organic resin. The light-transmitting insulating film 51 and the light-transmitting insulating film 52 are formed by a CVD method, a sputtering method, a coating method, or the like.

The liquid crystal element has the pixel electrode 66, the liquid crystal layer 54, and a counter electrode 56. The counter electrode 56 is formed on a counter substrate 57, and the liquid crystal layer 54 is interposed between the pixel electrode 66 and the counter electrode 56. Note that the thickness of the counter substrate is preferably 70 μm to 100 μm. In addition, the liquid crystal layer 54 is surrounded by a sealant (not shown) between the substrate 1 and the counter substrate 57.

Over the pixel electrode 66, one of the first color filter 6, the second color filter 7, and the third color filter 10 is provided in each pixel. Over the color filters, the alignment film 53, the liquid crystal layer 54, an alignment film 55, the counter electrode 56, and the counter substrate 57 having a light-transmitting property are provided. A spacer maintains the distance between the substrate 1 and the counter substrate 57, in other words, the thickness of the liquid crystal layer 54. The substrate 1 and the counter substrate 57 are provided with a light polarization plate or the like (not shown). Additionally, a retardation plate or the like may be provided.

For the pixel electrode 66 and the counter electrode 56, a light-transmitting conductive material such as indium tin oxide, indium tin oxide containing silicon oxide, organoindium, organotin, zinc oxide, indium zinc oxide containing zinc oxide, zinc oxide containing gallium, tin oxide, indium oxide containing tungsten oxide, indium zinc oxide containing tungsten oxide, indium oxide containing titanium oxide, indium tin oxide containing titanium oxide, or the like can be used.

The alignment film 53 is provided between the pixel electrode 66 and the liquid crystal layer 54, and the alignment film 55 is provided between the counter electrode 56 and the liquid crystal layer 54. The alignment film 53 and the alignment film 55 can be formed using an organic resin such as polyimide or polyvinyl alcohol. The surfaces are subjected to alignment treatment such as rubbing in order to align liquid crystal molecules in a certain direction. Rubbing can be performed by rotating a roller wrapped with cloth of nylon or the like while applying pressure to the alignment film so that the surface of the alignment film is rubbed in a certain direction. Note that by using an inorganic material such as silicon oxide, the alignment films 53 and 55 each having an alignment property can be directly formed by an evaporation method without performing alignment treatment.

The liquid crystal element is a switch for determining whether to allow light from a backlight and light reflected from an object to be detected to be transmitted or not, in combination with a light polarization plate that is not shown. The liquid crystal element may be a twisted nematic (TN) mode, a vertical alignment (VA) mode, an optically compensated birefringence (OCB) mode, an in-plane switching (IPS) mode, or the like. Note that although an example of the liquid crystal element in which the liquid crystal layer 54 is interposed between the pixel electrode 66 and the counter electrode 56 is given in this example, a touch panel according to one mode of the present invention is not limited to this structure. A liquid crystal element in which a pair of electrodes are formed on the substrate 1 side like an IPS mode liquid crystal element may also be employed.

Note that the liquid crystal layer 54 may be formed using a liquid crystal which exhibits a blue phase, for which an alignment film is not necessary. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which 5 wt. % or more of a chiral agent is mixed is used for the liquid crystal layer 54 in order to broaden the temperature range. As for the liquid crystal composition which contains a liquid crystal which exhibits a blue phase and a chiral agent, the response time is as short as 10 μs to 100 μs, alignment treatment is not necessary due to its optical isotropy, and viewing angle dependence is low.

The spacer which is not shown maintains a uniform thickness of the liquid crystal layer 54. The spacer may be either a columnar spacer or a spherical spacer. The spacer is formed using an organic resin, a glass bead, or the like.

A method of manufacturing the liquid crystal display device will be described below. The liquid crystal display device can be basically manufactured by the method described in Embodiment 1.

The first light-blocking layer 2, the second light-blocking layer 3, and a light-blocking layer 58 are formed over the first substrate 1 by the method of Embodiment 1, and the first light-transmitting insulating film 11 is formed.

The first photodiode 4, the second photodiode 5, and the semiconductor element 65 are formed over the first light-transmitting insulating film 11. The first photodiode 4 and the second photodiode 5 are formed by the method of Embodiment 1. In the case where the first photodiode 4 and the second photodiode 5 are lateral-junction diodes, they can be manufactured by the same steps as those for manufacturing the semiconductor element 65. This will be described below.

A semiconductor film is formed over the first light-transmitting insulating film 11 by a CVD method, a sputtering method, or the like. After that, the crystallinity of the semiconductor film may be improved by heat treatment, laser irradiation, or the like.

Note that the semiconductor film can be also formed by bonding and separating. First, hydrogen ions ($H^+$, $H^{2+}$, $H^{3+}$, or the like), or hydrogen ions and helium ions, are added to a semiconductor wafer such as a silicon wafer to form an embrittled layer in the semiconductor wafer. The semiconductor wafer is bonded to the first light-transmitting insulating film 11 and is separated along the embrittled layer by heat treatment to form a semiconductor film over the first light-transmitting insulating film 11. The thickness of a portion of the semiconductor wafer from the surface to the embrittled layer corresponds to the thickness of the semiconductor film; therefore, the thickness of the semiconductor film can be adjusted by controlling the conditions of the addition of hydrogen ions or the like. Furthermore, when the semiconductor wafer is single-crystal, a single crystal semiconductor film can be formed.

The semiconductor layer 101, the semiconductor layer 102, and the semiconductor layer 103 are formed by processing the semiconductor film by a photolithography method and an etching method.

The light-transmitting insulating film 50 functioning as a gate insulating film is formed over the semiconductor layer 101, the semiconductor layer 102, and the semiconductor layer 103 in the manner described above.

A metal film is formed over the light-transmitting insulating film 50. The metal film is processed by a photolithography method and an etching method to form the gate electrode 60 over the semiconductor layer 103 with the gate insulating film interposed therebetween.

Impurity ions which impart p-type or n-type conductivity are selectively added to the semiconductor layer 101, the semiconductor layer 102, and the semiconductor layer 103 to form n-type layers and p-type layers, and a source region and a drain region.

Next, the light-transmitting insulating film 51 is formed. After contact holes are formed in the light-transmitting insulating film 51, the electrode 43, the electrode 44, the electrode 48, the electrode 49, the source electrode 61, and the drain electrode 62 are formed. Thus, the first photodiode 4, the second photodiode 5, and the semiconductor element 65 are formed.

Next, the light-transmitting insulating film 52 having planarity is formed. A contact hole is formed in the light-transmitting insulating film 52. The contact hole reaches the drain electrode 62 and is used for forming the pixel electrode. In addition, a groove which is used for forming the third light-blocking layer 8 is formed in the light-transmitting insulating films 50 to 52.

The pixel electrode 66 connected to the drain electrode 62 is formed over the light-transmitting insulating film 52.

The first color filter 6 is formed in the pixel 111 by the method of Embodiment 1. The first color filter 6 is also formed in the groove described above. Next, the second color filter 7 is formed in the pixel 112. The second color filter 7 is also formed in the groove described above. The third light-blocking layer 8 is formed so as to fill the groove. Similarly, the third color filter 10 is formed in the pixel 120. The fifth light-blocking layer 16 formed with the second color filter 7 and the third color filter 10 is formed in the groove.

Next, the alignment film 53 is formed and then subjected to rubbing treatment. The alignment film 53 is not necessarily formed if there is another way to align the liquid crystal molecules in one direction.

The spacer is formed. As the spacer, a columnar spacer is formed by applying an organic resin and then processing the organic resin by photolithography and etching. Alternatively, spherical spacers are scattered. Alternatively, the spacer may be formed on either the first substrate 1 or the counter substrate 57.

The liquid crystal layer 54 is formed by dropping liquid crystal or the like. Injection of the liquid crystal layer 54 may be performed by a dispenser method (dripping method) or a dipping method (pumping method). Alternatively, after the substrate 1 and the counter substrate 57 are bonded to each other, vacuum injection may be performed.

The counter electrode 56 and the alignment film 55 are formed on the counter substrate 57. After that, the first substrate 1 and the counter substrate 57 are bonded to each other such that the alignment film 55 and the liquid crystal layer 54 are in contact with each other. In such a manner, the liquid crystal display device can be manufactured.

Although an example in which a thin semiconductor film is used for the photodiodes and the semiconductor elements is given in this example, a single crystal semiconductor substrate, an SOI substrate, or the like may be used for the photodiodes and the semiconductor elements.

Note that this example can be freely combined with Embodiment 1 and other examples.

EXAMPLE 2

An electroluminescent display device (hereinafter referred to as an "EL display device") which is one mode of the present invention will be described below.

Figure 8:
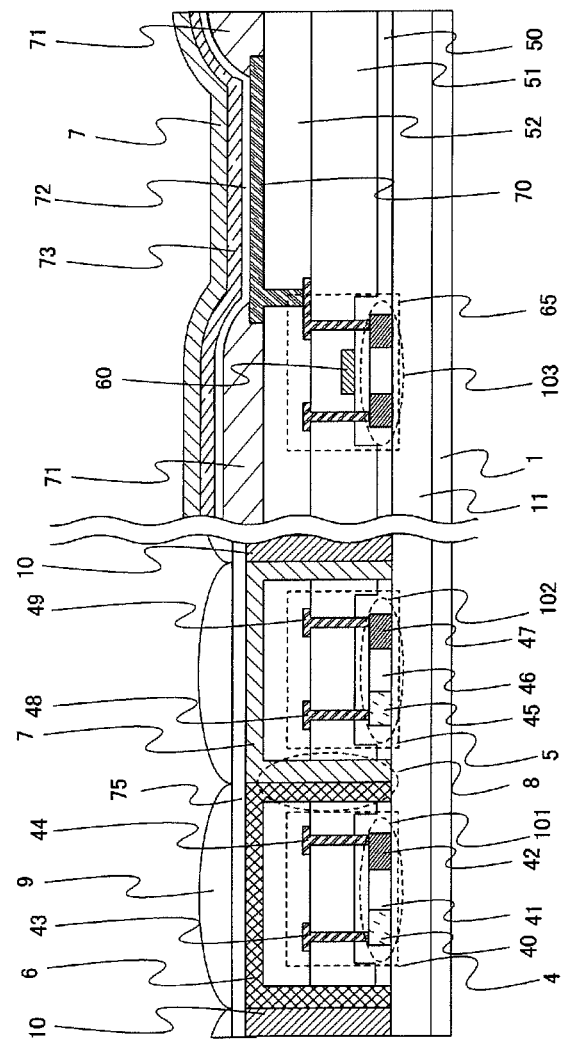
FIG. 8 is a cross-sectional view illustrating Example 2 which is one mode of the present invention.

FIG. 8 illustrates an example of a cross-sectional view of an EL display element with an EL element (for example, an organic EL element, an inorganic EL element, or an EL element including an organic substance and an inorganic substance) used as a light-emitting element. The display device of Example 1 and the light-emitting device of this example are different in that the display device of Example 1 has the liquid crystal element, the first light-blocking layer 2, the second light-blocking layer 3, and the light-blocking layer 58, while the light-emitting device of this example has the EL element and does not have the first light-blocking layer 2, the second light-blocking layer 3, and the light-blocking layer 58. The photodetection method of the display device of Example 1 and that of the light-emitting device of Example 2 are also different in that the display device of Example 1 uses the backlight, while the light-emitting device of Example 2 does not.

The photodetection method in the EL display device of this example is basically similar to Embodiment 1 and Example 1. Note that light emitted from not a backlight but an EL element is reflected by a portion to be detected. The light reflected by the portion to be detected is collected by microlenses and detected by the first photodiode 4 and the second photodiode 5.

The light-emitting device which is one mode of the present invention includes a photodetection portion and a display portion. The photodetection portion has a structure similar to those in Embodiment 1 and Example 1. Note that the first light-transmitting insulating film 11 and a first electrode 70 in Example 1 do not necessarily need to have a light-transmitting property in this example. In addition, over the color filters, the alignment film 53 is not provided and a light-transmitting insulating film 75 is formed as needed.

The display portion includes, over the substrate 1, the semiconductor element 65, the first electrode 70 connected to the semiconductor element 65, a partition 71 formed using an insulating film covering the ends of the first electrode 70, a light-emitting layer 72 over the first electrode 70, a second electrode 73 over the light-emitting layer 72, and the second color filter 7 over the second electrode 73.

The semiconductor element 65 is the same as that of Example 1. The semiconductor element 65 controls the amount of current to be supplied to the light-emitting layer 72. The display portion is provided with an additional semiconductor element which is not illustrated. One of the source and drain regions of the additional semiconductor element is connected to the gate electrode 60 of the semiconductor element 65; thus, the additional semiconductor element serves as a switch for controlling the operation of the semiconductor element 65. In addition, a storage capacitor for maintaining the potential of the gate electrode 60 of the semiconductor element 65 may be formed.

The EL element is formed by stacking the first electrode 70, the light-emitting layer 72, and the second electrode 73. Over the light-transmitting insulating film 52, the first electrode 70 is provided, and the partition 71 is provided so as to cover the ends of the first electrode 70.

The partition 71 is used for partitioning the pixel portion. The partition 71 is provided between adjacent pixels. The partition 71 is formed using an inorganic or organic insulating film.

The light-emitting layer 72 is interposed between the first electrode 70 and the second electrode 73 and emits light when supplied with a current. The light-emitting layer 72 preferably emits white light. The light-emitting layer 72 may be formed using a known organic or inorganic material. In addition, the first electrode 70 does not necessarily need to be transparent and preferably reflects light which is emitted from the light-emitting layer 72.

The second color filter 7 is the same as those in Embodiment 1 and Example 1.

In this example, a backlight is not used, and thus the first light-blocking layer 2, the second light-blocking layer 3, and the light-blocking layer 58 are not formed.

A method for manufacturing the light-emitting device will be described below. The method of manufacturing the light-emitting device is the same as that in Example 1 except for the steps performed after the first electrode 70 is formed.

An organic resin film or an inorganic insulating film is formed over the first electrode 70 and processed by photolithography and etching to form the partition 71.

The light-emitting layer 72 is formed over the first electrode 70 by a vacuum evaporation method, a droplet discharge method, or the like.

The second electrode 73 is formed over the light-emitting layer 72 by a sputtering method, an evaporation method, or the like.

The first color filter 6 is formed by the method described in Embodiment 1 and Example 1. The first color filter 6 is also formed in the groove in the light-transmitting insulating films 50 to 52. Next, the second color filter 7 is formed. The second color filter 7 is also formed in the groove described above. The third light-blocking layer 8 is formed so as to fill the groove. Similarly, the third color filter 10 is formed. The fifth light-blocking layer 16 formed with the second color filter 7 and the third color filter 10 is formed in the groove.

Through the above steps, the light-emitting device can be manufactured. The light-emitting layer 72 can be degraded by moisture; therefore, a sealing member may be additionally provided.

Note that this example can be freely combined with Embodiment 1 and other examples.

EXAMPLE 3

In this example, examples of electronic devices using a touch panel will be described with reference to FIGS. 9A to 9F.

Figure 9:
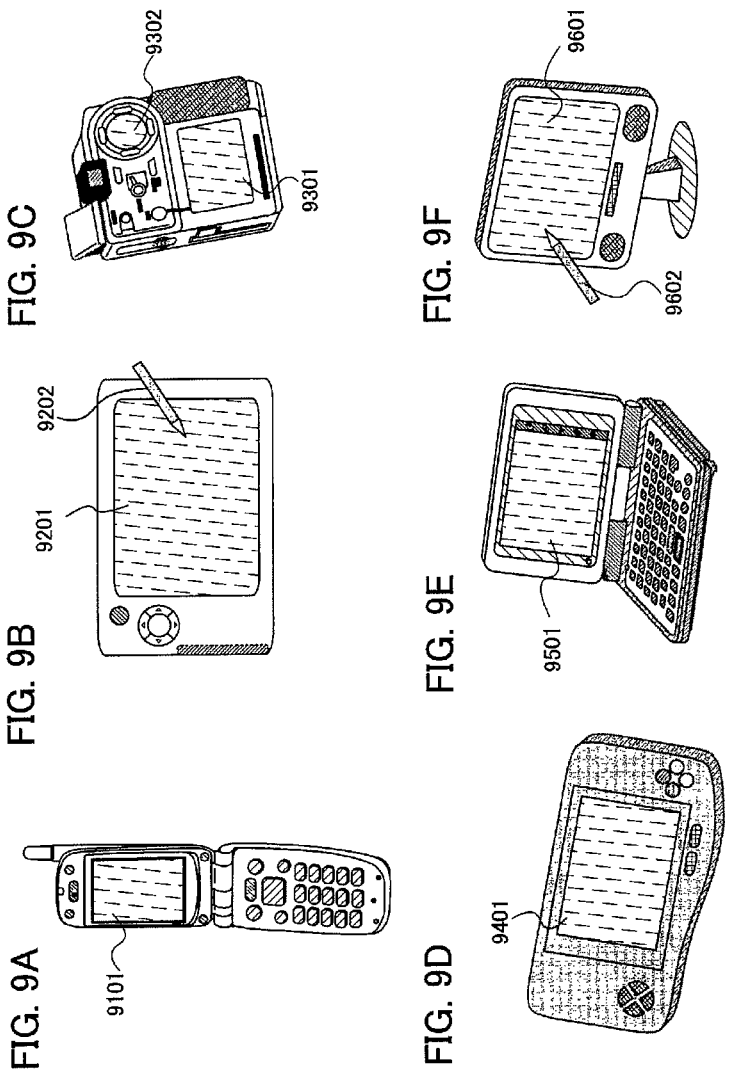
FIGS. 9A to 9F are diagrams of applications illustrating Example 3 which is one mode of the present invention.

A cellular phone shown in FIG. 9A includes a display portion 9101. A portable information terminal shown in FIG. 9B includes a display portion 9201, an input pen 9202, and the like. A digital video camera shown in FIG. 9C includes a display portion 9301, a display portion 9302, and the like. A portable game machine shown in FIG. 9D includes a display portion 9401 and the like. A portable information terminal shown in FIG. 9E includes a display portion 9501 and the like. A television device shown in FIG. 9F includes a display portion 9601, an input pen 9602, and the like. By using a touch panel which is one mode of the present invention, a touch panel with high photosensitivity can be provided.

Note that this example can be freely combined with Embodiment 1 and other examples.

EXAMPLE 4

An example of a writing board (blackboard, whiteboard, or the like) using a display portion that includes a photosensor will be described.

Figure 10:
FIG. 10 is a diagram of an application illustrating Example 4 which is one mode of the present invention.

For example, the display portion including a photosensor is provided at the position of a panel 9696 in FIG. 10.

The panel 9696 includes a photosensor and a display element.

Here, it is possible to freely write down letters or the like on the surface of the panel 9696, with a marker pen or the like.

Note that it is easy to erase letters if the letters are written with a marker pen or the like which does not include a fixing agent.

In addition, the surface of the panel 9696 preferably has adequate smoothness in order that the ink of the marker pen may easily be removed.

For example, the surface of the panel 9696 is adequately smooth if made using a glass substrate or the like.

Further, a transparent synthetic resin sheet or the like may be attached to the surface of the panel 9696.

As a synthetic resin, acrylic or the like is preferably used, for example. In this case, the surface of the synthetic resin sheet is preferably made smooth.

In addition, since the panel 9696 includes a display element, the panel 9696 can display a particular image and at the same time, it is possible to write down letters or the like on the surface of the panel 9696 with a marker pen.

Further, since the panel 9696 includes the photosensor, letters written with a marker pen can be read and printed out if the panel 9696 is connected to a printer or the like.

Furthermore, since the panel 9696 includes the photosensor and the display element, by writing down letters or the like or drawing a graphic or the like on the surface of the panel 9696 while the panel 9696 displays an image, the panel 9696 can display a trail of a marker, which has been read by the photosensor, combined with the image.

Note that sensing with resistive touch sensors, capacitive touch sensors, or the like can be performed only at the same time as writing with a marker pen or the like.

Meanwhile, sensing with a photosensor is superior in that it can be performed anytime even long after writing has been done with a marker pen or the like.

This example can be implemented by being freely combined with Embodiment 1 and other examples.

This application is based on Japanese Patent Application serial no. 2009-193302 filed with Japan Patent Office on Aug. 24, 2009, the entire contents of which are hereby incorporated by reference.

What is claimed is:

1. A photodetector comprising:
    a first photodiode over a substrate;
    a second photodiode over the substrate
    a first color filter covering the first photodiode;
    a second color filter covering the second photodiode;
    a first microlens over the first color filter;
    a second microlens over the second color filter; and
    a first light-blocking layer comprising a part of the first color filter and a part of the second color filter between the first photodiode and the second photodiode.

2. The photodetector according to claim 1, wherein the part of the second color filter overlaps with the part of the first color filter in a direction from the first photodiode to the second photodiode.

3. The photodetector according to claim 1, wherein the substrate is a light-transmitting substrate.

4. The photodetector according to claim 3, further comprising a second light-blocking layer over the light-transmitting substrate and a third light-blocking layer over the light-transmitting substrate,
    wherein the first photodiode is provided over the second light-blocking layer with a light-transmitting insulating film interposed therebetween, and
    wherein the second photodiode is provided over the third light-blocking layer with the light-transmitting insulating film interposed therebetween.

5. The photodetector according to claim 4, wherein the part of the first color filter and the part of the second color filter are in contact with the light-transmitting insulating film.

6. A photodetector comprising:
    a first photodiode over a substrate;
    a second photodiode over the substrate;
    a first microlens over the first photodiode;
    a second microlens over the second photodiode;
    a first color filter covering the first microlens;
    a second color filter covering the second microlens; and
    a first light-blocking layer comprising a part of the first color filter and a part of the second color filter between the first photodiode and the second photodiode.

7. The photodetector according to claim 6, wherein the part of the second color filter overlaps with the part of the first color filter in a direction from the first photodiode to the second photodiode.

8. The photodetector according to claim 6, wherein the substrate is a light-transmitting substrate.

9. The photodetector according to claim 8, further comprising a second light-blocking layer over the light-transmitting substrate and a third light-blocking layer over the light-transmitting substrate,
    wherein the first photodiode is provided over the second light-blocking layer with a light-transmitting insulating film interposed therebetween, and
    wherein the second photodiode is provided over the third light-blocking layer with the light-transmitting insulating film interposed therebetween.

10. The photodetector according to claim 9, wherein the part of the first color filter and the part of the second color filter are in contact with the light-transmitting insulating film.

11. A photodetector comprising:
    a first photodiode over a substrate;
    a second photodiode over the substrate;
    a first light-transmitting insulating layer covering the first photodiode;
    a second light-transmitting insulating layer covering the second photodiode;
    a first color filter over the first photodiode with the first light-transmitting insulating layer interposed therebetween;
    a second color filter over the second photodiode with the second light-transmitting insulating layer interposed therebetween;
    a first microlens over the first color filter;
    a second microlens over the second color filter;
    a first light-blocking layer provided in a groove which is provided between the first light-transmitting insulating layer and the second light-transmitting insulating layer;
    a second light-blocking layer over the substrate; and
    a third light-blocking layer over the substrate;
    wherein the first photodiode overlaps with the second light-blocking layer;
    wherein the second photodiode overlaps with the third light-blocking layer;
    wherein the second light-blocking layer is between the first photodiode and the substrate; and
    wherein the third light-blocking layer is between the second photodiode and the substrate.

12. The photodetector according to claim 11, wherein the first light-blocking layer comprises a part of the first color filter and a part of the second color filter.

13. The photodetector according to claim 12, wherein the part of the second color filter overlaps with the part of the first color filter in a direction from the first photodiode to the second photodiode.

14. The photodetector according to claim 11, wherein the substrate is a light-transmitting substrate.

15. A display device comprising:
    a backlight;
    a first light-transmitting substrate over the backlight;
    a liquid crystal layer over the first light-transmitting substrate;
    a second light-transmitting substrate over the liquid crystal layer;
    a first photodiode over the first light-transmitting substrate;
    a second photodiode over the first light-transmitting substrate;
    a first color filter covering the first photodiode;
    a second color filter covering the second photodiode;
    a first microlens over the first color filter;
    a second microlens over the second color filter; and
    a first light-blocking layer comprising a part of the first color filter and a part of the second color filter between the first photodiode and the second photodiode.

16. The display device according to claim 15, wherein the part of the second color filter overlaps with the part of the first color filter in a direction from the first photodiode to the second photodiode.

17. The display device according to claim 15, further comprising a second light-blocking layer over the first light-transmitting substrate and a third light-blocking layer over the first light-transmitting substrate, wherein the first photodiode is provided over the second light-blocking layer with a light-transmitting insulating film interposed therebetween, and wherein the second photodiode is provided over the third light-blocking layer with the light-transmitting insulating film interposed therebetween.

18. The display device according to claim 17, wherein the part of the first color filter and the part of the second color filter are in contact with the light-transmitting insulating film.

19. A display device comprising:
- a substrate;
- a light-emitting layer over the substrate;
- a light-transmitting substrate over the light-emitting layer;
- a first photodiode over the substrate;
- a second photodiode over the substrate;
- a first color filter covering the first photodiode;
- a second color filter covering the second photodiode;
- a first microlens over the first color filter;
- a second microlens over the second color filter; and
- a first light-blocking layer comprising a part of the first color filter and a part of the second color filter between the first photodiode and the second photodiode.

20. The display device according to claim 19, wherein the part of the second color filter overlaps with the part of the first color filter in a direction from the first photodiode to the second photodiode.

21. The display device according to claim 19, wherein the substrate is a light-transmitting substrate.

22. The display device according to claim 21, further comprising a second light-blocking layer and a third light-blocking layer over the substrate, wherein the first photodiode is provided over the second light-blocking layer with a light-transmitting insulating film interposed therebetween, and wherein the second photodiode is provided over the third light-blocking layer with the light-transmitting insulating film interposed therebetween.

23. The display device according to claim 22, wherein the part of the first color filter and the part of the second color filter are in contact with the light-transmitting insulating film.

* * * * *

UNITED STATES PATENT AND TRADEMARK OFFICE
CERTIFICATE OF CORRECTION

| | | |
|---|---|---|
| PATENT NO. | : 8,625,058 B2 | Page 1 of 1 |
| APPLICATION NO. | : 12/861476 | |
| DATED | : January 7, 2014 | |
| INVENTOR(S) | : Munehiro Kozuma et al. | |

It is certified that error appears in the above-identified patent and that said Letters Patent is hereby corrected as shown below:

In the Specification

Column 1, line 14, replace "light-transmitting," with --light-transmitting--;

Column 2, line 11, after "second light-blocking" delete ",";

Column 8, line 28, replace "lateral junction" with --lateral-junction--;

Column 8, line 29, replace "lateral junction" with --lateral-junction--;

Column 8, line 32, replace "lateral junction" with --lateral-junction--.

Signed and Sealed this
Twenty-fourth Day of June, 2014

Michelle K. Lee
*Deputy Director of the United States Patent and Trademark Office*